(12) United States Patent
Burger et al.

(10) Patent No.: US 10,950,589 B2
(45) Date of Patent: Mar. 16, 2021

(54) OPTOELECTRONIC APPARATUS, CARRIER DEVICE, OPTOELECTRONIC TRANSMITTER AND OPTOELECTRONIC RECEIVER

(71) Applicant: Vishay Semiconductor GmbH, Heilbronn (DE)

(72) Inventors: Daniel Burger, Leingarten (DE); Sascha Kuhn, Oedheim (DE); Peter Mühleck, Offenau (DE)

(73) Assignee: Vishay Semiconductor GmbH, Heilbronn (DE)

(*) Notice: Subject to any disclaimer, the term of this patent is extended or adjusted under 35 U.S.C. 154(b) by 152 days.

(21) Appl. No.: 16/078,882

(22) PCT Filed: Feb. 22, 2017

(86) PCT No.: PCT/EP2017/054069
§ 371 (c)(1),
(2) Date: Aug. 22, 2018

(87) PCT Pub. No.: WO2017/144535
PCT Pub. Date: Aug. 31, 2017

(65) Prior Publication Data
US 2019/0057958 A1    Feb. 21, 2019

(30) Foreign Application Priority Data
Feb. 23, 2016    (DE) .............. 10 2016 103 123.2

(51) Int. Cl.
*H01L 25/16*    (2006.01)
*H01L 31/0232*    (2014.01)
(Continued)

(52) U.S. Cl.
CPC .............. *H01L 25/167* (2013.01); *G02B 6/43* (2013.01); *G02B 27/0955* (2013.01);
(Continued)

(58) Field of Classification Search
CPC ............ H01L 31/0203; H01L 31/0232; H01L 31/02005; H01L 25/167; H01L 31/02325;
(Continued)

(56) References Cited

U.S. PATENT DOCUMENTS 5,170,047 A * 12/1992 Beauchamp .......... B43L 13/024
250/202
5,266,797 A    11/1993 Zuefferey
(Continued)

FOREIGN PATENT DOCUMENTS

DE    10241934 A1    4/2003
DE    10261246 A1    7/2004
(Continued)

*Primary Examiner* — Khiem D Nguyen
(74) *Attorney, Agent, or Firm* — Volpe Koenig (57) ABSTRACT

An optoelectronic apparatus is provided having a carrier device that has at least one optoelectronic transmitter and/or at least one optoelectronic receiver at an upper side; at least one first optical element, a second optical element, and a third optical element that are arranged in a layer arrangement above the carrier device, with the second optical element being arranged above the first optical element and the third optical element being arranged above the second optical element, and with each of the at least three optical elements comprising a lens element, an aperture element or a filter element; and a holding device that holds at least the first optical element and the second optical element relative to the carrier device and partly surrounds them, with the holding device furthermore either holding the third optical element relative to the carrier device and partly surrounding the third optical element or forming the third optical element.

22 Claims, 8 Drawing Sheets

(51) Int. Cl.
  *H01L 31/167* (2006.01)
  *H01L 31/0203* (2014.01)
  *H01L 31/02* (2006.01)
  *G02B 6/43* (2006.01)
  *G02B 27/09* (2006.01)
  *H04B 10/40* (2013.01)

(52) U.S. Cl.
  CPC .... *H01L 31/0203* (2013.01); *H01L 31/02005* (2013.01); *H01L 31/02325* (2013.01); *H01L 31/167* (2013.01); *H04B 10/40* (2013.01)

(58) Field of Classification Search
  CPC ... H01L 31/167; H01L 31/18; G02B 27/0955; G02B 6/4246; G02B 6/4214; G02B 6/4204; G02B 6/4212; G02B 6/4225; G02B 6/43; H04B 10/40
  See application file for complete search history.

(56) References Cited

U.S. PATENT DOCUMENTS

| | | | |
|---|---|---|---|
| 6,764,158 B2 | 4/2003 | Arquilevich et al. | |
| 8,674,305 B2 | 10/2013 | Rossi | |
| 9,305,746 B2 * | 4/2016 | Becker | H01J 37/08 |
| 2003/0067502 A1 * | 4/2003 | Arquilevich | B41J 2/16579 |
| | | | 347/19 |
| 2007/0009223 A1 * | 1/2007 | Rudmann | H01L 27/14687 |
| | | | 385/147 |
| 2008/0002460 A1 * | 1/2008 | Tuckerman | H01L 31/0203 |
| | | | 365/158 |
| 2010/0200735 A1 * | 8/2010 | Barna | G03B 11/00 |
| | | | 250/214.1 |
| 2012/0292660 A1 * | 11/2012 | Kanno | H05K 3/32 |
| | | | 257/99 |
| 2013/0105822 A1 * | 5/2013 | Wang | H01L 31/125 |
| | | | 257/82 |
| 2014/0267876 A1 * | 9/2014 | Chen | H01L 27/14618 |
| | | | 348/335 |
| 2015/0226839 A1 | 8/2015 | Brandi et al. | |

FOREIGN PATENT DOCUMENTS

| | | |
|---|---|---|
| JP | S64-36943 U | 3/1989 |
| JP | H06-050743 A | 2/1994 |
| JP | H08-184740 A | 7/1996 |
| JP | 2003-179252 A | 6/2003 |
| JP | 2011-146271 A | 7/2011 |
| JP | 2012-122858 A | 6/2012 |
| JP | 2015-509184 A | 3/2015 |
| JP | 2015162473 A | 9/2015 |

* cited by examiner

OPTOELECTRONIC APPARATUS, CARRIER DEVICE, OPTOELECTRONIC TRANSMITTER AND OPTOELECTRONIC RECEIVER

CROSS REFERENCE TO RELATED APPLICATIONS

This application is a § 371 application of International Application No. PCT/EP2017/054069, filed Feb. 22, 2017, which is incorporated by reference as if fully set forth.

FIELD OF INVENTION

The present invention relates to an optoelectronic apparatus having a carrier device that has at least one optoelectronic transmitter and/or at least one optoelectronic receiver at an upper side. The carrier device can simultaneously serve for the electrical contacting of the optoelectronic transmitter and of the optoelectronic receiver. At least one optical element is arranged above the carrier device, i.e. above the transmitter and receiver with respect to the vertical direction, for an optical influencing of a radiation associated with the transmitter and/or with the receiver.

BACKGROUND

Such optoelectronic apparatus are in particular configured as optoelectronic sensor apparatus to be able to optically scan and electronically detect properties of objects. An application for such sensor apparatus is in the sector of commercially available printer devices, i.e. apparatus for a computer-assisted printing of paper by means of known printing technologies, e.g. laser printing technology or ink-jet printing technology. To allow an operation of a printer (or of a multifunctional device comprising a printer) that is as fully automatic and as user-friendly as possible, different operating parameters of the printer such as a quantity or a type of the paper placed into the reception tray of the printer, a provided paper format, the relative position of a paper edge and the like are determined and are monitored as necessary. There is furthermore a need for an automatic analysis of a respective print result or of a paper to be scanned in order e.g. to check the content type (image vs. text) of the paper to be scanned and the correct configuration (e.g. mechanical alignment of a printing unit of the printer) with reference to a print result.

An individually adapted optoelectronic apparatus is typically provided for each operating parameter to be measured and is configured to compare an emitted optical signal with a detected, e.g. reflected, optical signal to be able to determine the respective operating parameter from the difference of these optical signals. The optical signals are generally electromagnetic radiation of a visible or non-visible wavelength, in particular infrared. The apparatus frequently comprises both an optoelectronic transmitter and (at least) one optoelectronic receiver. The apparatus can thus, for example, act as a proximity sensor. Apparatus having a plurality of transmitters and receivers are furthermore possible, with an apparatus e.g. being able to determine a plurality of operating parameters, in particular simultaneously, (e.g. by a distinction between diffuse and reflective reflection).

Due to the large number of operating parameters to be measured, a corresponding variety of optoelectronic apparatus is required, which is associated with an unwanted cost effort in manufacture and storage. Furthermore, an optoelectronic apparatus for measuring a respective operating parameter has to satisfy specific optical properties that may differ greatly in dependence on the respective operating parameter and may require a high development effort in this respect. The optical properties are in particular to be understood as the guiding, shaping or filtering of beams or of optical signals that are transmitted by the optoelectronic transmitter and/or are received by the optoelectronic receiver for the measurement of the respective operating parameter. In this respect, a geometrical restriction of the beams may also be necessary, with in particular a cross-sectional extent and/or an angular range of the beams being fixed.

SUMMARY

It is an object of the invention to provide an apparatus of the initially named kind whose optical properties can be fixed in a simple manner.

The object is satisfied by an optoelectronic apparatus having the features of claim 1 and in particular in that the optoelectronic apparatus comprises at least one first optical element, a second optical element and a third optical element that are arranged in a layer arrangement above the carrier device, wherein the second optical element is arranged above the first optical element and the third optical element is arranged above the second optical element, and wherein each of the at least three optical elements comprises a lens element, an aperture element or a filter element. A holding device is furthermore provided that holds at least the first optical element and the second optical element relative to the carrier device and partly surrounds at least the first optical element and the second optical element, wherein the holding device furthermore either holds the third optical element relative to the carrier device and partly surrounds the third optical element, or wherein the holding device forms the third optical element.

The relevant optical properties of the apparatus with respect to the optoelectronic transmitter or receiver are fixed by the at least three optical elements. In this respect, one or more of the three optical elements can together form an optical channel for the transmitter or receiver. Such an optical channel therefore forms an optical path of incidence or emission path of the optoelectronic apparatus, with the optical channel having an imaginary axis that preferably extends through the optoelectronic transmitter or receiver and defines the geometrical and/or optical center of a radiation-permeable region of the optoelectronic apparatus extending sectionally through the optoelectronic apparatus. The axis of the optical channel can e.g. extend perpendicular or inclined with respect to a plane of extent of the carrier device. A separate associated optical channel is preferably provided for each optoelectronic transmitter and receiver arranged at the optoelectronic apparatus.

An advantage of the invention comprises at least three separate optical elements being provided. The optical properties of the optical channel can hereby be fixed in a simple manner and nevertheless with a high precision.

The optoelectronic apparatus is characterized by a modular design in which the apparatus is assembled in the manner of a module system from different, separate components. These separate components comprise at least the carrier device, the first optical element, the second optical element, and the holding device, with the third optical element likewise being able to be formed separately or being able to be integrated into the holding device. The individual components are preferably releasably connected to one another or held at one another. The components can in particular be held at one another in a force-transmitting and/or shape-matched manner. The components are arranged substantially behind one another along the named vertical direction, i.e. in a layer arrangement or in a sandwich structure. Different variants of the carrier device, of the optical elements as well as optional components can hereby be combined with one another in a simple manner on the basis of a universal modular platform to produce different optoelectronic apparatus, with some components of the different optoelectronic apparatus being able to be the same (e.g. the holding device).

The optoelectronic apparatus can be at least substantially of parallelepiped shape, with at least some of the named separate components being able to have an elongate, substantially rectangular outline.

The carrier device of the optoelectronic apparatus can be at least substantially of plate shape and/or can comprise an overmolded lead frame. The carrier device can comprise a plurality of electrical connectors that can be connected to an ASIC (application-specific integrated circuit) of the carrier device and/or to the optoelectronic transmitter or receiver. The connectors of the carrier device can enable an electrical contacting from the outside. The connectors can in particular be provided for connection of the carrier device to a microcontroller associated with the optoelectronic apparatus in order to be able to operate the apparatus in accordance with the application. The initially named vertical direction can in particular extend perpendicular to a plane of extent of the carrier device.

The holding device serves to hold at least the carrier device and the first and second optical elements relative to one another, with an alignment of the two optical elements with respect to the carrier device being observed that is equipped with the at least one optoelectronic transmitter and at least one optoelectronic receiver. In this respect, the holding device can secure and/or fix the first optical element and/or the second optical element directly or indirectly to the carrier device. The holding device can for this purpose, for example, have a clip or at least a clip-like element that at least engages around or engages behind the carrier device and the first and second optical elements. Additionally or alternatively, the holding device can be formed in the manner of a housing or of a cage, with such a holding device not having to completely surround the carrier device, the first optical element and the second optical element, in particular not over the whole surface and also not at every side of the apparatus. The holding device can thus serve at least functionally as a housing of the apparatus or can even be a real, at least predominantly closed housing, with at least a mechanical encapsulation of the components of the apparatus being ensured. It is understood that the third optical element (if the third optical element is formed separately and is not, for instance, integrated into the holding device) as well as further components can be held or fixed by the holding device.

The holding device can in particular have a base plate having a plurality of side walls and/or having a plurality of, in particular two, four or six, holding arms or holding sections disposed opposite one another pairwise. The base plate can have a uniform plate size that is e.g. adapted to the shape and size of the carrier device and/or of one of the optical elements. The apparatus can hereby be robust and compact, with an adhesion or penetration of dirt and the like on or into the apparatus respectively being avoided. The base plate is preferably arranged at a lower side of the carrier device and forms a bottom section. The holding device can have an at least sectionally step-shaped and/or U-shaped cross-section and/or a plurality of openings such that a component of the apparatus that is placed into the holding device and that is formed at least sectionally complementary to the holding device is captured laterally and/or in the vertical direction in the holding device without separate fastening means being required for this purpose. For example, the carrier device, the first optical element, the second optical element and, optionally, the third optical element can be captured in the vertical direction, i.e. the respective component is fixed between the holding device and another component of the apparatus or between two other components of the apparatus by mutual contact in the vertical direction. The holding device can furthermore be formed in one part or in multiple parts, in particular in two parts.

The optical elements can at least substantially be of plate shape, with the plate size and/or the plate shape being able to correspond to a uniform plate size and/or plate shape of at least some of the components of the apparatus.

A lens element is to be understood in connection with the invention as an imaging element that can in particular have refractive properties. The lens element can in particular have a lens section for the at least one optoelectronic transmitter and/or a lens section for the at least one optoelectronic receiver.

The respective lens section can have beam-shaping properties, in particular in that the respective lens section has an arch at one side or at two sides (e.g. as a converging lens, a diverging lens or as a Fresnel lens). Alternatively or additionally hereto, the respective lens section can effect a deflection of beams, i.e. a change in the direction of propagation of emitted or received beams. The respective lens section can in particular have a wedge shape (e.g. design as a wedge lens having two planar surfaces aligned at an acute angle with one another). The respective lens section can be aligned in parallel with or obliquely to a plane of extent of the carrier device. The lens element can be of plate shape outside the respective lens section. The respective lens section can be formed integrally and/or can be arranged above the optoelectronic transmitter or receiver.

If one of the optical elements comprises an aperture element, it can define a range of angles of incidence for optical beams that are incident onto the at least one optoelectronic receiver. Alternatively or additionally, the aperture element defies a range of emission angles for optical beams that are emitted through the optical channel by at least one optoelectronic transmitter. The respective angular range can in particular be defined by an alignment and by an opening angle, whereby an optical channel is at least sectionally defined.

The aperture element can in particular have an aperture section for the at least one optoelectronic transmitter and/or an aperture section for the at least one optoelectronic receiver. A respective aperture section can be formed by an opening of the respective aperture element that is, for example, circular or oval and that is coaxially aligned or offset with respect to the axis of the formed optical channel. Geometrical optical properties of the optoelectronic apparatus can be fixed and unwanted interference influences (e.g. due to internal or outer reflections) can be suppressed by the arrangement and shape of the respective aperture section. A plurality of separate aperture elements can advantageously be provided for this purpose that are equipped with a respective aperture element, with each of the aperture elements being able to effect a restriction of the cross-section of the beams emitted by the associated transmitter and/or received by the associated receiver. For example, two optical elements forming a respective aperture element can be arranged at different spacings from the carrier device, in particular at different sides of a lens element. Each of the aperture elements can thus make a contribution to the desired optical properties of the optical channel, with the optical properties realized by each aperture element being superposed together or being combined in a functional manner (e.g. restriction of the range of the angles of incidence or of the range of emission angles and function as a scattered light diaphragm). In other words, the measures of the geometrical restriction of the beams for implementing the designed optical properties of the optoelectronic apparatus can be distributed over two or more aperture elements. The mechanical complexity of the respective aperture elements can hereby be kept smaller in comparison with the case of a single aperture element, which, on the one hand, simplifies the design, but, on the other hand, also the industrial manufacture of the aperture elements.

To define the named ranges of the angles of incidence and/or emission, the respective aperture section of the aperture element can have a cross-section tapering in the direction toward the carrier device. The respective aperture section can in particular be formed by an at least substantially frustoconical opening that can in particular be sheared with an inclined axis of the optical channel.

At least one of the optical elements of the optoelectronic apparatus can comprise a filter element that has spectral filter properties. The filter element can in particular have a planoparallel filter section that has spectral filter properties.

It is understood that a respective optical element does not exclusively have to comprise either a lens element, an aperture element or a filter element. Combinations of a lens element, aperture element and filter element are also possible. For example, a lens element having integrated spectral filter properties can be provided. However, this does not affect the fact that at least three optical elements are always provided of which each satisfies at least one of the named functions (refraction, aperture, filtering).

The modular design of the apparatus is particularly advantageous in the combination with the at least three optical elements to be able to inexpensively manufacture a plurality of different apparatus types having substantially uniform components only differing slightly. In this respect, the optical properties required for a respective apparatus type can, for example, be defined in that the shape and/or the position of at least one aperture section of an aperture element of one of the optical elements, the shape and/or position of a lens section of a lens element and/or the shape and/or position of a filter section of a filter element are adapted. For this purpose, different selectable aperture elements and/or different selectable lens elements and/or different selectable filter elements can be provided. The basic design of the optoelectronic apparatus, in particular the outer shape of the individual components, does not need to be changed in this respect.

Some exemplary configurations of the layer arrangement of the three optical elements will be explained in the following.

In accordance with an embodiment, the first optical element comprises a first aperture element, the second optical element comprises a lens element and the third optical element comprises a further aperture element. In other words, the first aperture element is arranged beneath the lens element and the further (second) aperture element is arranged above the lens element. On the one hand, the first aperture element is hereby less spaced apart from the carrier device than the second aperture element. On the other hand, the two aperture elements are spaced apart from one another by the lens element. Such an arrangement of aperture elements is advantageous to implement a specific optical purpose through each aperture element. For example, the first (lower) aperture element can be adapted to co-determine an angular characteristic of the optical channel (inclination of the optical axis of the optical channel relative to the plane of the carrier device and the opening angle) and/or to at least reduce scattered light within the optoelectronic apparatus. Scattered light within the optoelectronic apparatus can e.g. be light reflected at the carrier device that should not move through the optical channel into the measurement environment of the apparatus. The second (upper) aperture element can, in contrast, be adapted to reduce or to block a penetration of scattered light from the measurement environment into the apparatus. A two-stage optical restriction of the beams can be implemented in this manner that is particularly effective and can nevertheless be simply implemented. It is understood that the named purposes of the aperture elements are only exemplary.

In accordance with a further embodiment, the first optical element comprises a lens element, the second optical element comprises an aperture element and the third optical element comprises a further lens element. In particular a desired refraction characteristic can hereby be distributed over two optical elements.

As a further alternative to the above-named configurations, one of the three optical elements can comprise a lens element, another one of the three optical elements can comprise an aperture element and yet another of the three optical elements can comprise a filter element. In this respect, the lens element can be formed, for example, by the third optical element (that is the topmost of the three optical elements).

It is understood that still other configurations of optical elements than the named configurations can be provided. More than three optical elements can in particular also be used. The layer arrangement preferably comprises at least one aperture element and one lens element.

In accordance with a further embodiment, the first optical element and the second optical element are captured between the third optical element and the carrier device in a vertical direction, i.e. the first and second optical elements are indirectly fastened to the apparatus in at least the vertical direction such that no separate fastening of these optical properties is necessary and the components of the apparatus can be easily combined with different first and second optical elements. The first and/or second optical elements as well as further components, in particular also the third optical element, can for this purpose be configured at least sectionally (e.g. at the respective periphery) in a complementary manner to the holding device.

In accordance with a further embodiment, at least one of the at least three optical elements has at least one receiving recess for a (partial or complete) receiving of another one of the at least three optical elements. The first and/or third optical elements can preferably be received partly and/or in a shape-matched manner in a receiving recess of the second optical element. The optoelectronic apparatus can hereby be configured in a particularly compact manner, with the first and/or third optical elements received in the receiving recess preferably terminating in alignment with an outer surface of the second optical element. The position of the first and/or third optical elements can furthermore be fixed in a particularly reliable manner by the receiving recess relative to the second optical element (laterally and/or in the vertical direction), with the optical sections (lens section, aperture section, filter section) of the respective optical elements being exactly aligned with one another for manufacturing the optical channel when the respective optical element is received in the receiving recess.

In accordance with a further embodiment, the holding device is formed in two parts, with the holding device having a lower part and an upper part. The lower part and the upper part can in this respect in particular be releasably secured to one another, with the lower part and/or the upper part being able to engage around or to engage behind the first optical element, the second optical element, the carrier device as well as, optionally, the third optical element (if separately formed) and further optional components of the apparatus. The lower part of the holding device can have a bottom section and a plurality of connection sections protruding upwardly therefrom. The upper part of the holding device can furthermore have a top section and a plurality of connection sections projecting downwardly therefrom that cooperate with the connection sections of the lower part. The lower part and/or the upper part can have a substantially U-shaped cross-section to form a receiving space at least for the carrier device and the lens element, said receiving space simplifying the manufacture of the apparatus.

The carrier device, the first optical element, the second optical element as well as, optionally, the third optical element (if separately formed) can be arranged between the lower part and the upper part of the holding device and can in particular be captured between the lower part and the upper part of the holding device in a vertical direction. The optoelectronic apparatus can thus be assembled particularly efficiently since at least the carrier device, the first optical element and the second optical element do not have to be separately fastened. For example, the carrier device, the first optical element, the second optical element and, optionally, the third optical element (if separately formed) can be placed into the lower part with the lower part then being closed by the upper part, and with the components placed in above the carrier device hereby being automatically fixed to the carrier device.

The lower part and the upper part of the holding device can in particular be fastened to one another by means of a latch connection.

Alternatively to the case of a third optical element placed into the lower part, the third optical element can be formed by the upper part of the holding device. The third optical element (e.g. the aperture element) is, for example, integral with the upper part of the holding device, which is advantageous with respect to a compact construction shape of the optoelectronic apparatus and with respect to a small number of components.

In accordance with a further embodiment, the holding device is formed in one part and has an open upper part, with the third optical element being arranged at the upper side of the holding device. The third optical element can be configured to close the open upper side (apart e.g. from an aperture opening). The third optical element can in particular be fastened to the holding device by a latch connection.

In accordance with a further embodiment, one of the at least three optical elements has a mechanical coding section that projects out of the holding device and that has at least one coding element for identifying the optoelectronic apparatus. Different types or kinds of optoelectronic apparatus can hereby be distinguished from one another, in particular in the course of their assembly. This is e.g. advantageous when a plurality of different optoelectronic apparatus have to be assembled together in a (printer) device, wherein the apparatus are externally similar due to a uniform modularity and can therefore be easily confused. The risk of confusion between different optoelectronic apparatus is, however, effectively reduced by the coding section.

The invention furthermore relates to a system comprising a plurality of different optoelectronic apparatus in accordance with any one of the preceding embodiments, wherein the first optical elements of the plurality of different optoelectronic apparatus differ from one another with respect to their shape and/or wherein the second optical elements of the plurality of different optoelectronic apparatus differ from one another with respect to their shape and/or the third optical elements of the plurality of different optoelectronic apparatus differ from one another with respect to their shape. The optical properties of the different apparatus can thus be adapted in a simple manner despite a modular design with similar elements.

The invention furthermore relates to a system comprising a plurality of different optoelectronic apparatus in accordance with any one of the above embodiments, wherein—alternatively or additionally to the aforesaid system—the optical elements of at least some of the plurality of different optoelectronic apparatus differ from one another with respect to their respective arrangement, in particular with respect to their respective order along the named vertical direction.

For example, at least two of the optical elements of a respective optoelectronic apparatus can comprise a respective aperture element, wherein the aperture elements of at least some of the different optoelectronic apparatus differ from the aperture elements of other ones of the different optoelectronic apparatus with respect to their respective arrangement and/or shape.

At least one component of the different optoelectronic apparatus is preferably identically formed within one of the named systems, in particular the holding device and/or the carrier device (apart from the optoelectronic or electronic elements provided thereat such as a transmitter, receiver and ASIC).

BRIEF DESCRIPTION OF THE DRAWING(S)

The invention will be described in the following purely by way of example with reference to the drawings, in which.

The same or similar elements in the drawings are marked by the same reference numerals.

DETAILED DESCRIPTION OF THE PREFERRED EMBODIMENT(S)

An optoelectronic apparatus 10 comprises a carrier device 12, a first optical element in the form of a first aperture 14, a second optical element in the form of a lens element 16, and a holding device comprising a lower part 18 and an upper part 20. The upper part 20 of the holding device simultaneously forms a third optical element in the form of a further aperture element of the optoelectronic apparatus 10 in the embodiment shown here. All of these components are shown obliquely from above in FIG. 1, i.e. the perspective is directed obliquely to a respective upper side of the components.

How the apparatus 10 is assembled will be described in the following, with the individual components of the optoelectronic apparatus 10 being explained in more detail.

Figure 1:
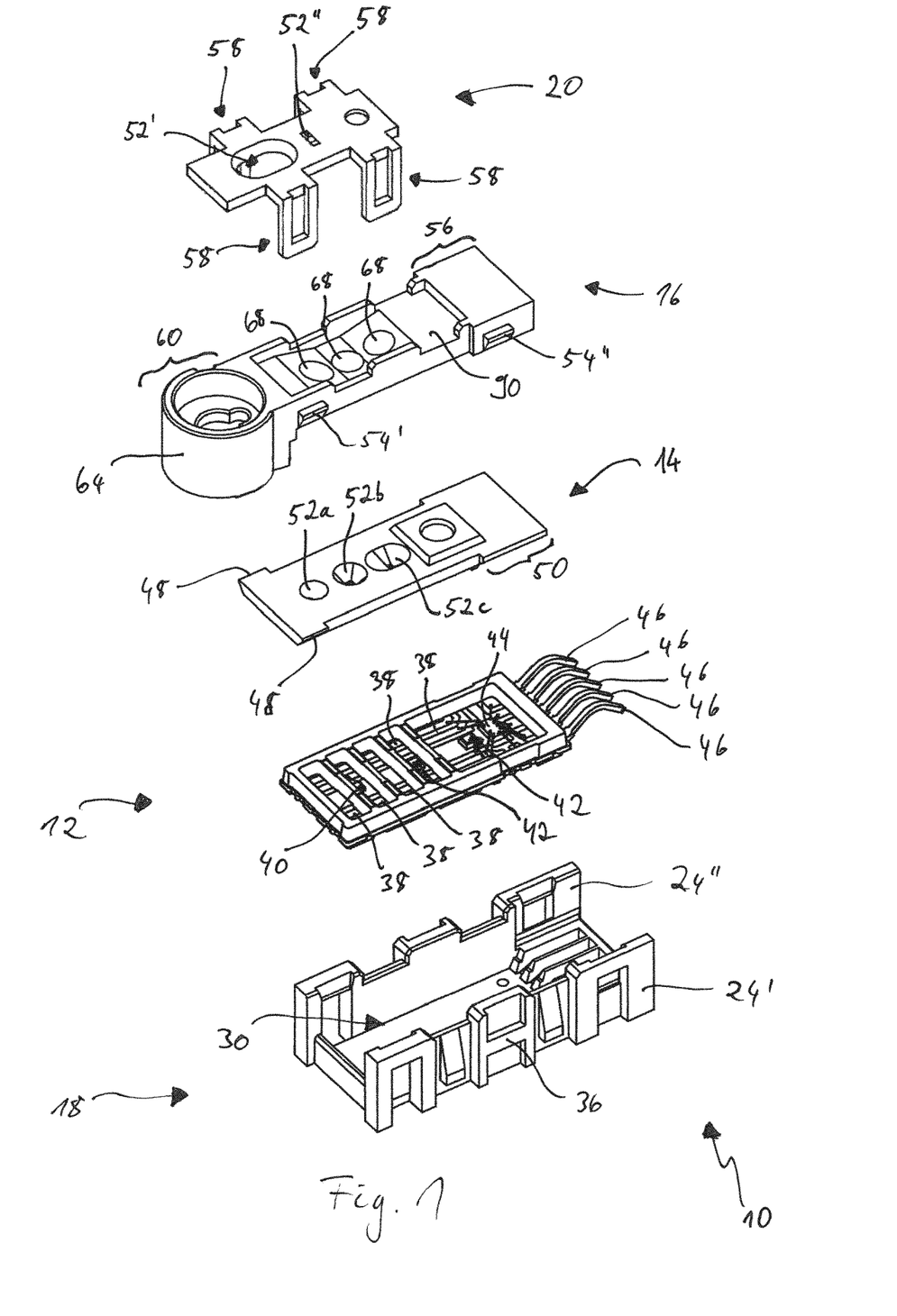
FIG. 1 is an exploded representation of an embodiment of an optoelectronic apparatus.
Figure 2:
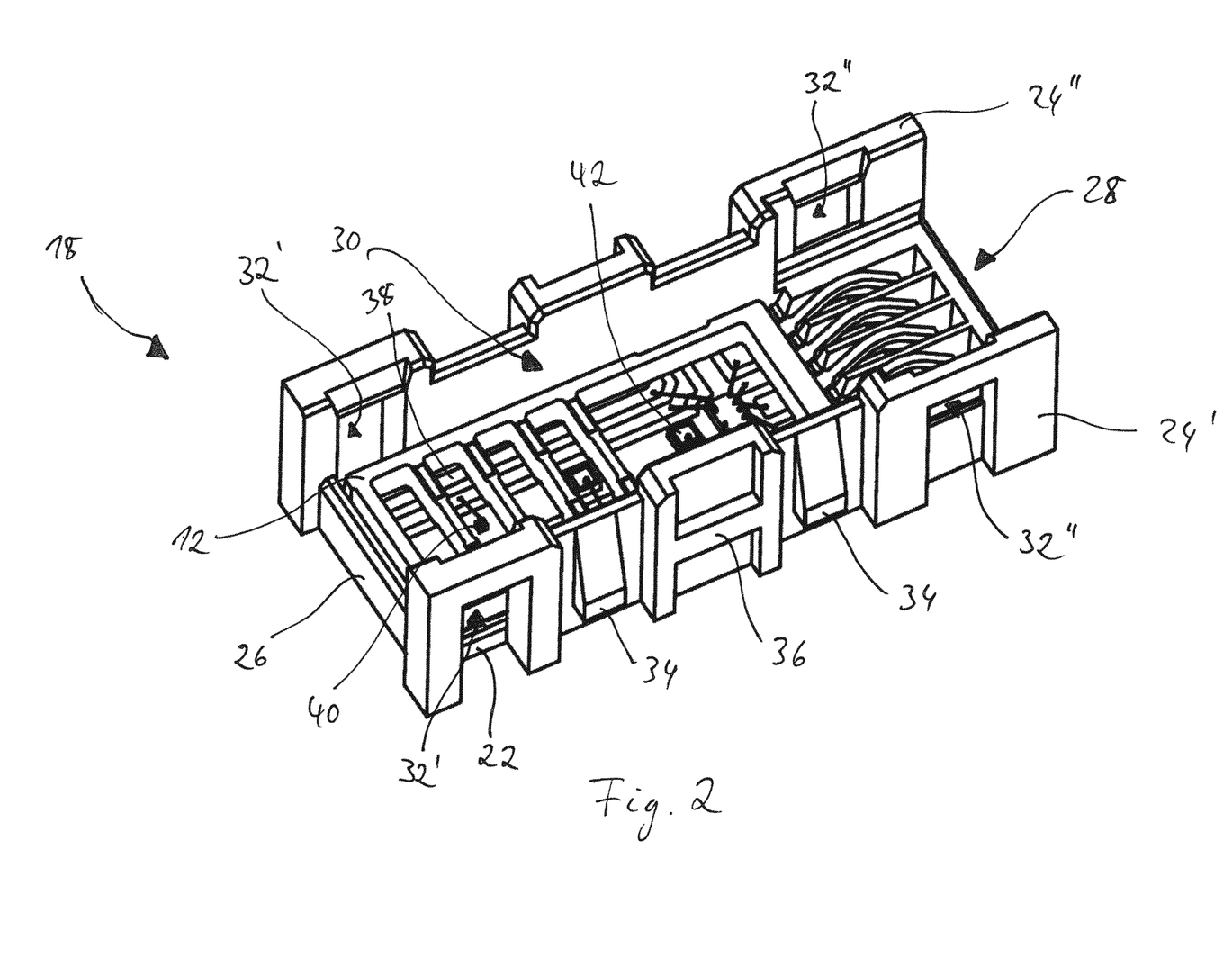
FIG. 2 is a perspective view of components of the apparatus of FIG. 1.

The carrier device 12 is first placed into the lower part 18. The lower part 18 with the inserted carrier device 12 is shown in FIG. 2, with the scale in FIG. 2 being enlarged with respect to FIG. 1. The lower part 18 has a bottom section 22 having a plurality of connection sections protruding upwardly therefrom. In detail, two side parts 24', 24" that are specularly symmetrical with respect to the longitudinal extent of the lower part 18 extend upwardly away from the bottom section 22, with the side parts 24', 24" being aligned substantially perpendicular to the bottom section 22. The bottom section 22 furthermore has an end face catch 26 as well as a meshing section 28. The lower part 18 formed in U shape in this manner has a receiving space 30 completely upwardly open and partly laterally open for receiving the carrier device 12, the aperture element 14 (first optical element) and the lens element 16 (second optical element). The size and shape of the receiving space 30 sectionally substantially correspond to the size and shape of the carrier device 12, of the aperture element 14 and of the lens element 16. The components 12, 14 and 16 can thus be placed into the lower part 18 with an exact fit.

The side parts 24', 24" each have two rectangular openings 32' and 32" as well as two mutually spaced apart latching noses 34 at the outer side. The side parts 24', 24" furthermore each have a centrally arranged latching catch 36 at the outside. The receiving space 30 is broadened with respect to the central region in the region of the meshing section 28.

The carrier device 12 is formed as an overmolded lead frame (a so-called "pre-molded lead frame") that can be variably equipped. The periphery of the carrier device 12 is complementary to the receiving space 30 of the lower part 18 such that the carrier device 12 can be placed into the lower part 18 as shown in FIG. 2, with the carrier device 12 being laterally captured in the plane of the bottom section 22 between the catch 26, the meshing section 28 and the side parts 24', 24". The upper side of the carrier device 12 is divided into a plurality of chambers 38 in the longitudinal direction, with an optoelectronic transmitter or an optoelectronic receiver generally being able to be attached and electrically contacted in each chamber 38. The carrier device 12 shown in FIG. 1 has an optoelectronic transmitter 40, two optoelectronic receivers 42 and an ASIC 44 (application-specific integrated circuit). To connect the carrier device 12 to an external microcontroller (not shown), a plurality of electrical connectors 46 are provided that extend away from the carrier device 12 in a uniform arcuate shape at a narrow side of the carrier device 12. When the carrier device 12 is placed into the lower part 18, the connectors 46 resiliently engage into the meshing section 28 of the lower part 18, whereby a contacting zone is formed for the introduction of an electrical plug-in connector (not shown) (FIG. 2).

Once the carrier device 12 has been placed into the lower part 18, the aperture element 14 (first optical element) is placed into the receiving space 30 of the lower part 18 (not shown). In this respect, a respective lateral projection 48 of the aperture element 14 engages into a respective opening 32', 32" of the side parts 24', 24" (FIG. 1 and FIG. 2). Furthermore, a broadened region 50 of the first aperture element 14 engages into the receiving space 30 broadened in the region of the meshing section 28. In this manner, the first aperture element 14 is in particular not displaceable in the longitudinal direction of the apparatus 10 and is secured to the lower part 18 in this respect. The first aperture element 14 in FIG. 1 furthermore has three differently formed aperture sections 52a, 52b and 52c that are arranged behind one another in the longitudinal direction at the first aperture element 14 and are formed by openings bordered in a substantially frustoconical shape.

Next, the lens element 16 (second optical element) is placed into the receiving space 30 of the lower part 18, with a respective lateral projection 54', 54" engaging into a respective opening 32', 32" of the side parts 24', 24". Furthermore, a broadened region 56 of the lens element 16 engages into the region of the receiving space 30 broadened in the region of the meshing section 28. The lens element 16 is in this manner fixed to the lower part 18 in the longitudinal and transverse direction in a plane in parallel with the bottom section 22.

Finally, the upper part 20 of the holding device is fastened by means of a latching connection to the lower part 18, with the upper part 20 for this purpose having four downwardly protruding latching tabs 58 that each latch with one of the latching noses 34 of the side parts 24', 24". The carrier device 12, the aperture element 14 and the lens element 16 are now completely captured and fixed to one another between the upper part 20 and the lower part 18. The lower part 18 of the holding device, the carrier element 12, the aperture element 14, the lens element 16 and the upper part 20 of the holding device are thus arranged behind one another along a vertical direction.

Figure 3:
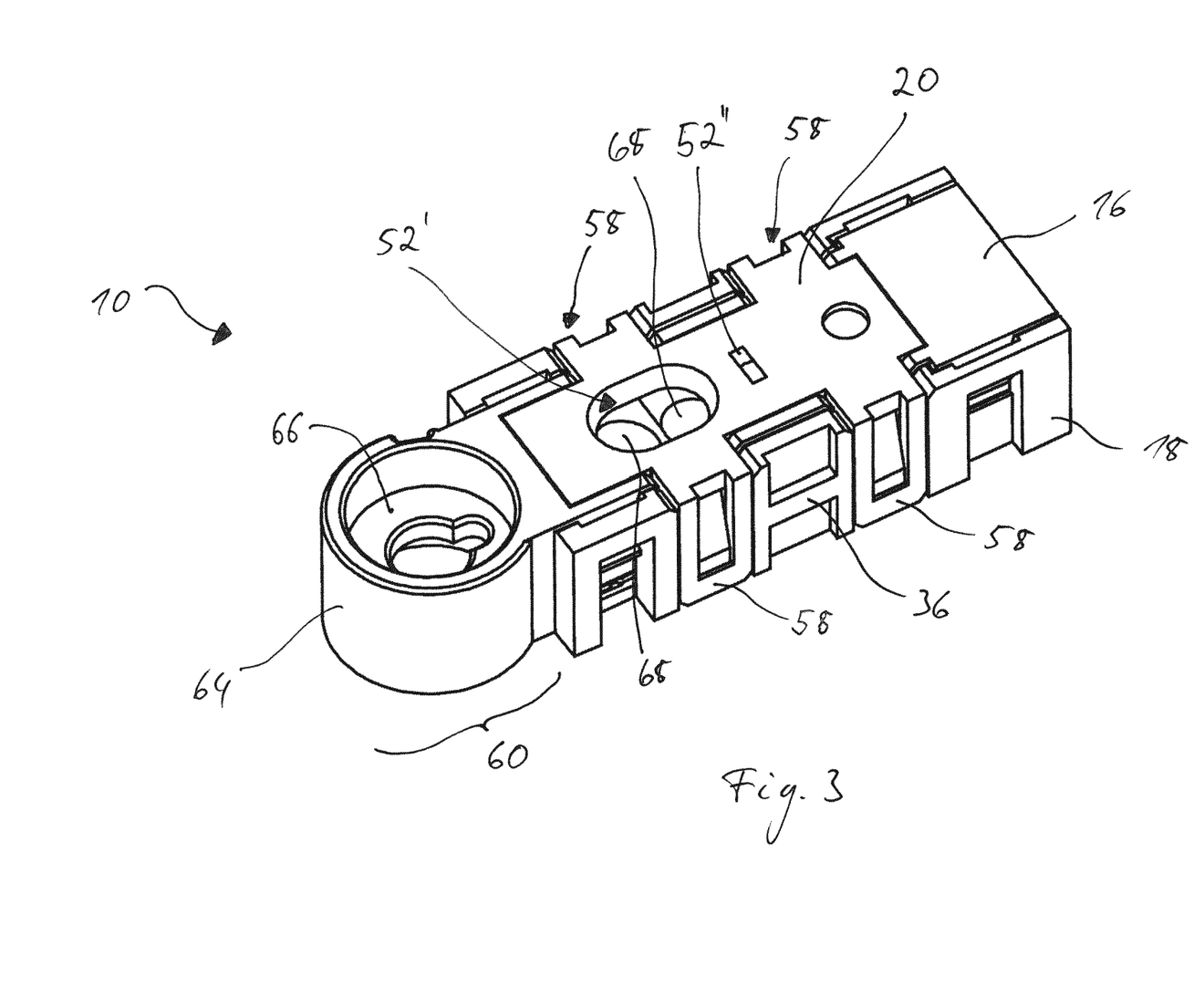
FIG. 3 is a perspective view of the apparatus of FIG. 1 in an assembled state.

The apparatus 10 assembled in this manner is shown in perspective in FIG. 3. The upper part 20 (further aperture element or third optical element of the apparatus 10) has two aperture sections 52', 52" (cf. FIG. 1 and FIG. 3). It can furthermore be recognized that the upper part 20 engages into a complementary engagement section 90 of the lens element 16 (cf. FIG. 1) such that the upper part 20 ends in alignment with the lens element 16 and a substantially smooth upper side of the apparatus 10 is formed. The lens element 16 is furthermore additionally fixed and the size of the apparatus 10 is kept small.

The optical properties of the optoelectronic apparatus 10 are fixed by the three aperture sections 52a, 52b and 52c of the first aperture element 14 in combination with the two aperture sections 52', 52" of the further aperture element or of the upper part 20 and unwanted interference influences are suppressed in that a geometrical boundary of the respective cross-section of the emitted or received beams takes place.

The apparatus 10 has a slim, substantially parallelepiped base body, with the outer skin of the apparatus being characterized by surfaces that substantially end in alignment with one another. The latching tabs 58 in particular end in alignment with the outer side of the side parts 24', 24".

The substantially plate-shaped lens element 16 (second optical element of the apparatus 10) has an integrally formed mechanical coding section 60 that extends away from the otherwise plate-shaped lens element 16 in the longitudinal direction (FIG. 1). The ring-shaped coding section 60 has a hollow cylinder 64 that protrudes perpendicular from a plane of extent of three lens sections 68 of the lens element 16 arranged behind one another in the longitudinal direction. The lens sections 68 of the lens element 16 have beam-shaping properties in the embodiment shown here and can, for example, comprise convex lenses, biconvex lenses or Fresnel lenses.

Figure 4:
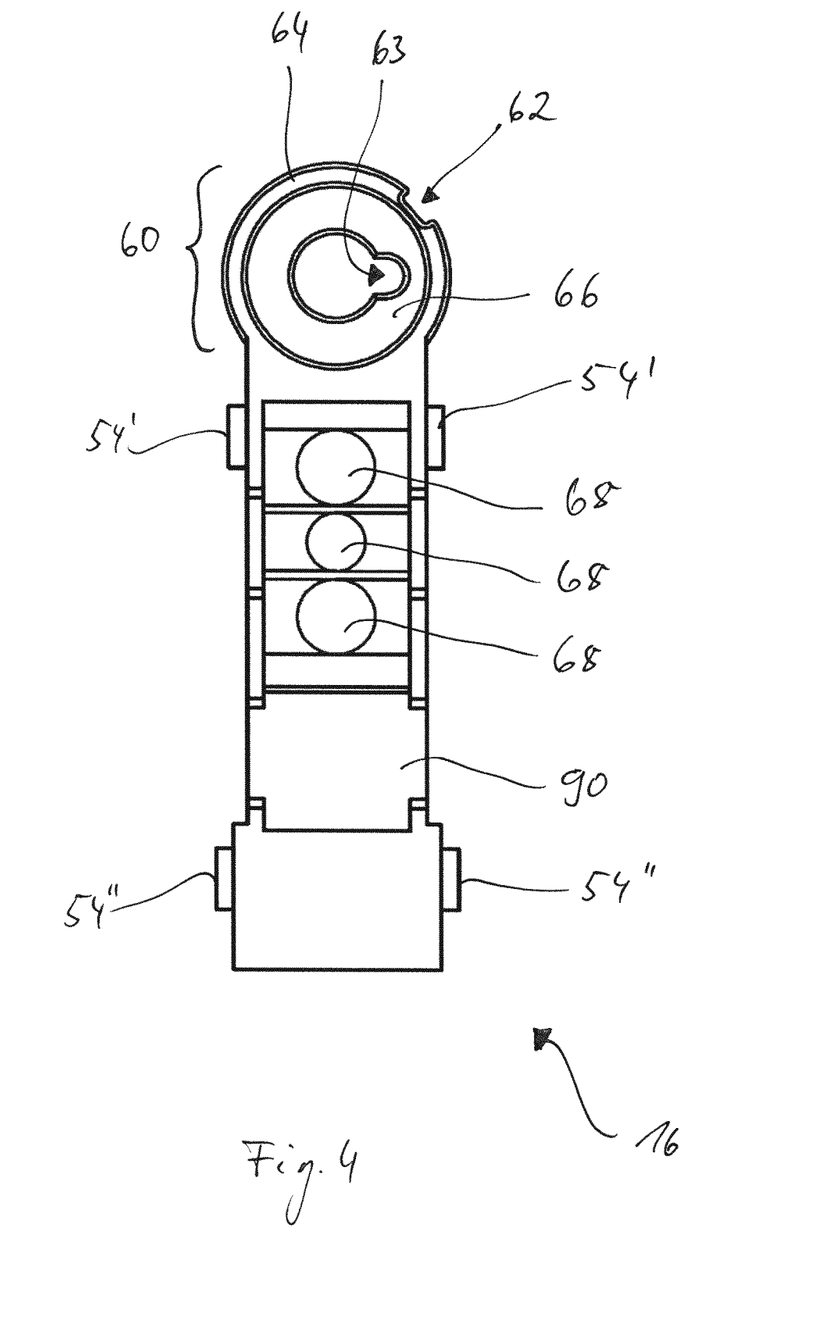
FIG. 4 is a plan view from above of a lens element of the apparatus of FIG. 1.

Further details on the lens element 16 are shown in FIG. 4 in which the lens element 16 is shown in a plan view of the upper side of the lens element 16. The lens element 16 shown in FIG. 4 has a first coding element 62 and a second coding element 63 at the coding section 60. The first coding element 62 is formed as a rectangular recess at the outer periphery of the hollow cylinder 64 of the coding section 60, with the first coding element 62 extending in parallel with the cylinder axis (perpendicular to the plane of the paper in FIG. 4) such that a rectangular groove is produced in the cylinder jacket of the hollow cylinder 64. A ring disk 66 extends within the hollow cylinder 64 perpendicular to its longitudinal axis. The second coding element 63 that is configured as a substantially semicircular recess and that extends in parallel with the cylinder axis as a round groove is provided at the inner periphery of the ring disk 66.

The first coding element 62 is only provided by way of example for the purpose of identifying the underlying apparatus 10 with respect to an apparatus type. An apparatus type is in particular characterized by the respective configuration of the lens element 16, of the upper part 20 and/or of the first aperture element 14 and by the equipping of the carrier device 12 with optoelectronic transmitters 40 or receivers 42. In this respect, the position and the configuration of lens sections 68 of the lens elements 16 can in particular differ. The second coding element 63 is provided to identify the apparatus 10 with respect to a bus that is provided for connecting the carrier device 12 to a microcontroller.

This list is only by way of example. In principle, the coding elements 62, 63 can identify the optoelectronic apparatus 10 with respect to freely definable features. The coding elements 62, 63 are only defined, in addition to their shape, in dependence on their angular position about the longitudinal axis of the hollow cylinder 64, with the angular position of the respective coding element 62, 63, enabling an unambiguous identification of the apparatus 10 with respect to feature associated with the respective coding element 62, 63.

Figure 5:
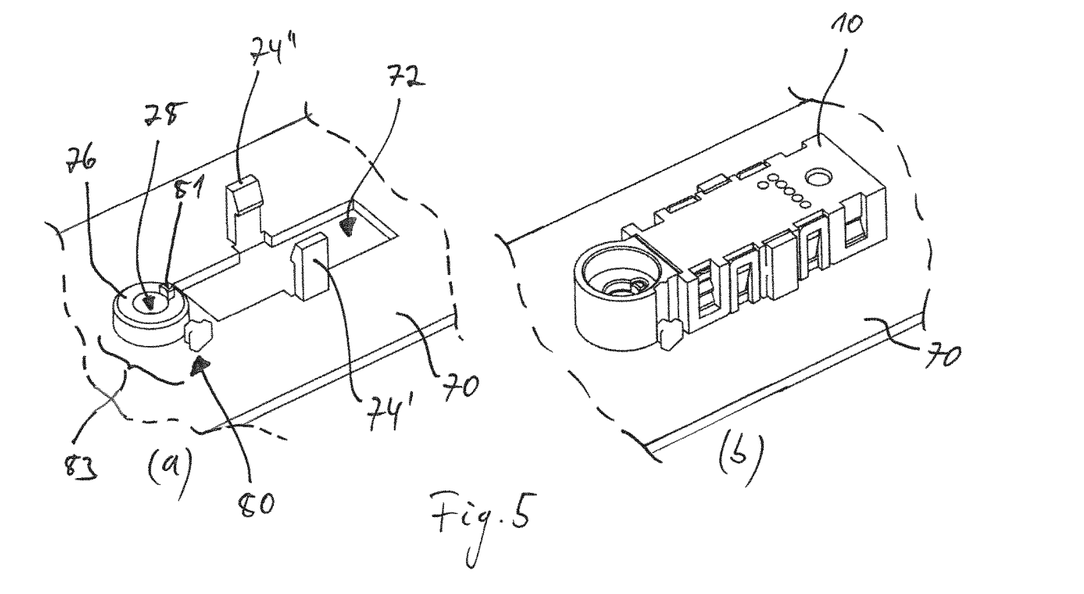
FIG. 5 comprises two perspective views of an installation site for an apparatus in accordance with FIG. 1, (a) without an installed apparatus and (b) with an installed apparatus.

Two perspective views of an installation site for an optoelectronic apparatus 10 are shown in FIG. 5 that is also called an installation environment of the optoelectronic apparatus 10 in connection with the invention. In FIG. 5(*a*), the installation site is shown as such, i.e. without a respective apparatus 10 being installed. The installation site is characterized by a section of a base plate 70 having a rectangular opening 72 at whose inner longitudinal edges two mutually oppositely disposed latching arms 74', 74" are provided. Adjacent to a narrow side of the opening 72, a cylinder 76 is formed that extends perpendicular to the plane of the base plate 70 and that is provided with a central opening 78. The opening 78 can have an internal thread for a screw, not shown.

The cylinder 76 has a first decoding element 80 and a second decoding element 81. The first decoding element 80 is of T shape and is spaced apart from the jacket surface of the cylinder 76 in the radial direction. The height of the decoding element 80 is less than the height of the cylinder 76. The second decoding element 81 is formed at the end face of the cylinder 76 and has a cylindrical shape sectionally. The cylinder 76 and the decoding elements 80 and 81 together form a decoding section 83 for the coding section 60 of an apparatus 10. The decoding section 83 is formed in one part with the base plate 70. The edges of the cylinder 76 and of the decoding elements 80 and 81 have a respective chamfer that facilitates the installation of the apparatus 10.

The apparatus 10 to be installed at the installation site shown in FIG. 5 (*a*) is installed with the upper side of the apparatus 10 at the front such that the apparatus 10 adopts the position shown in FIG. 5 (*b*) in which the upper side of the apparatus 10 faces the opening 72 of the base plate 70. It is ensured by the decoding section 83 that only that apparatus 10 can be installed that has a coding section 60 which is formed complementary to the decoding section 83 and which unambiguously defines the installation of the apparatus 10 at the respective installation site by shape matching. In the assembled state, the first coding element 62 engages into the first decoding element 80. The second coding element 63 furthermore engages sectionally into the second decoding element 81. The latching arms 74', 74" are furthermore latched to the latching catches 36 of the lower part 18 such that the apparatus 10 is securely fastened to the base plate 70.

Figure 6:
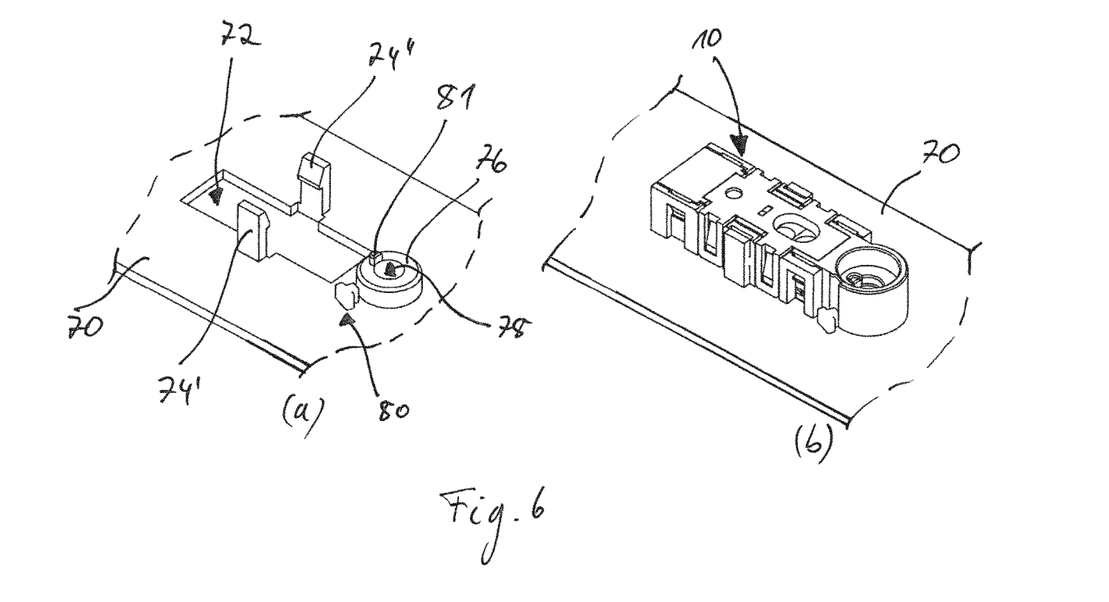
FIG. 6 comprises two perspective views of a further installation site for an apparatus in accordance with FIG. 1, (a) without an installed apparatus and (b) with an assembled apparatus.

A further installation site for an apparatus 10 is shown in FIG. 6, with the apparatus 10 being installed in reverse in FIG. 6 (*b*), unlike the case of FIG. 5 (*b*), i.e. the radiation-emitting or radiation-receiving upper side of the apparatus 10 is remote from the base plate 70. The apparatus 10 can thus be installed flexibly in different manners at an installation site formed substantially the same, with only the positions of the coding elements 62, 63 and the positions of the decoding elements 80, 81 having to be coordinated with one another for this purpose (cf. FIG. 5 (*a*) and FIG. 6 (*a*)).

The base shape of the coding section 60 (in particular the hollow cylinder 64 with the ring disk 66) is preferably formed symmetrically with respect to a center plane of the optoelectronic apparatus 10 that is perpendicular to the vertical direction. It is furthermore preferred if a fastening device for fastening the optoelectronic apparatus 10 to an installation environment (in particular the latching catches 36 of the holding device for the latching arms 74', 74" of the base plate 70) is formed symmetrically with respect to a center plane of the optoelectronic apparatus 10 that is perpendicular to the vertical direction. The apparatus 10 can hereby selectively be particularly simply fastened in one of two different alignments of its upper side at the installation environment, as has been explained with reference to FIGS. 5 and 6.

Figure 7:
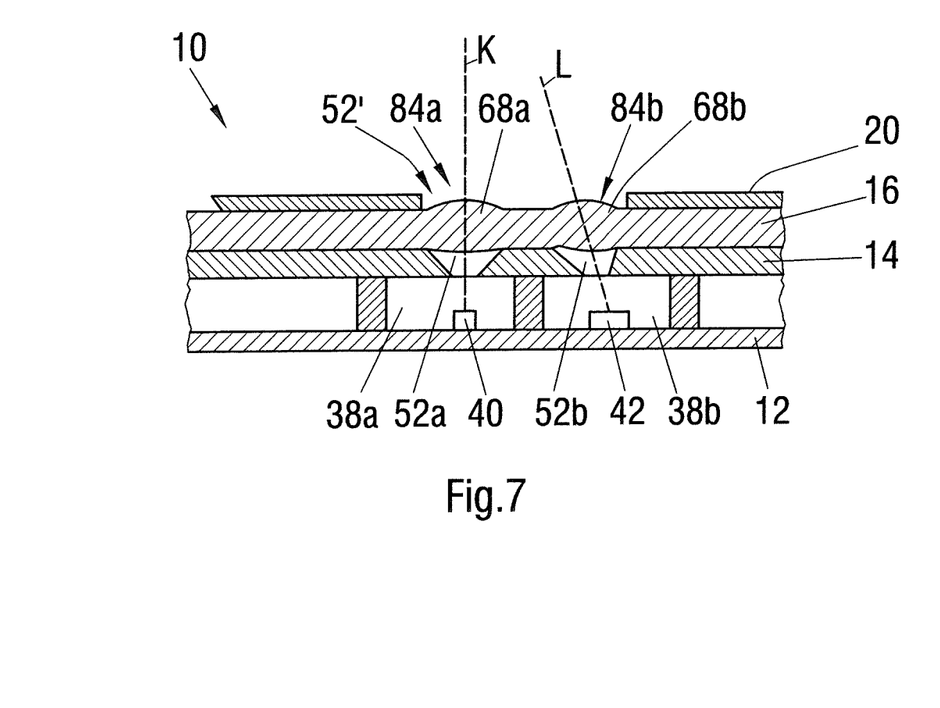
FIG. 7 is a schematic longitudinal sectional view of an optoelectronic apparatus.

FIG. 7 reproduces a longitudinal sectional view of a further exemplary optoelectronic apparatus 10 in accordance with the invention. The sandwich design corresponds to that of the optoelectronic apparatus 10 shown in FIG. 1, wherein a carrier device 12, a first optical element in the form of a first aperture element 14, a second optical element in the form of a lens element 16, and a third optical element in the form of a further aperture element 20 having an aperture section 52' are shown sectionally in FIG. 7. The carrier device 12, the first aperture element 14, the lens element 16, and the further aperture element 20 (third optical element) are held relative to one another by a holding device (not shown), with this holding device being able to be formed in one part and in another respect substantially like the lower part 18 in accordance with FIG. 1. An optoelectronic transmitter 40 is located in a chamber 38*a* of the carrier device 12. An optoelectronic receiver 42 is located in an adjacent chamber 38b. An optical channel 84a extends above the transmitter 40 and its axis K extends substantially perpendicular to the plane of extent of the carrier device 12 through the transmitter 40. An optical channel 84b extends above the receiver 42 and its axis L extends inclined to the plane of extent of the carrier device 12 through the receiver 42.

The aperture section 52' of the further aperture element 20 extends over both optical channel 84a and 84b in the horizontal direction and reduces an unwanted radiation input into the lens element 16 from lateral directions, i.e. directions that differ greatly from the extents of the axes K and L. The optical channels 84a, 84b each comprise a lens section 68a, 68b in the plane of the lens element 16. A respective substantially frustoconical aperture section 52a, 52b is provided beneath the lens sections 68a, 68b at the first aperture element 14. The one aperture section 52 is formed by a substantially rotationally symmetrical, frustoconical opening in the first aperture element 14. The other aperture section 52b is formed by a sheared frustoconical opening in the first aperture element 14, whereby the axis L of the optical channel 84b is inclined with respect to the carrier device 12. The optical properties can be particularly effectively adapted by the first aperture element 14 and the second aperture element 20 that are located in mutually different vertical positions. The lateral incidence of scattered light into the optical channels 84a, 84b through the upper part 20 can in particular be regulated independently of the cross-section-restricting properties of the first aperture element 14. It can thus e.g. be sufficient only to swap over the first aperture element 14 to implement a desired angle characteristic for an optical channel 84.

Figure 8:
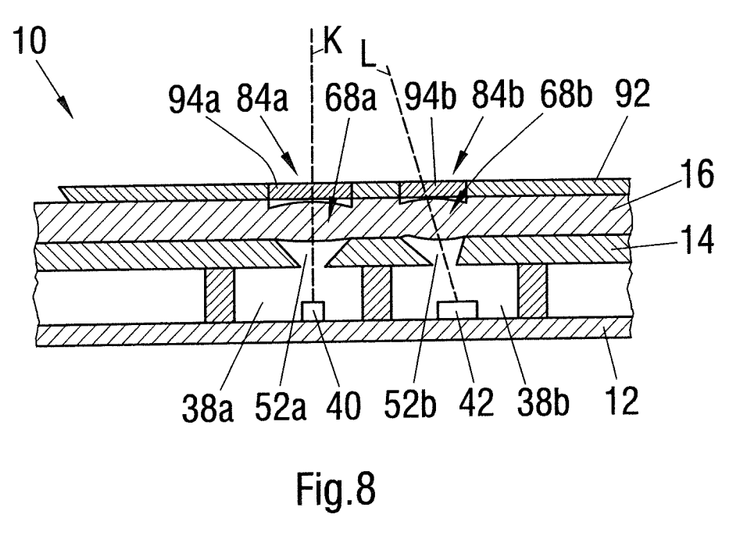
FIG. 8 is a schematic longitudinal sectional view of a further optoelectronic apparatus.

A longitudinal view of a further optoelectronic apparatus 10 is shown in FIG. 8 that is configured in a similar manner to that of FIG. 7. Differing from the apparatus of FIG. 7, a third optical element in the form of a filter element 92 that has two planoparallel filter sections 94 is arranged above the first aperture element 14 (first optical element) and above the lens element 16 (second aperture element). The filter sections 94 have spectral filter properties (e.g. infrared band pass), with the filter section 94a being aligned with the first optical channel 84a and the filter section 94b being aligned with the second optical channel 84b. The filter element 92 can be configured as an upper part of a two-part holding device or the filter element 92 is configured separately from a single-part holding device (e.g. a lower part 18 in accordance with FIG. 1), with the filter element 92 being able to form an end window of the single-part holding device (holding device not shown in FIG. 8).

Figure 9:
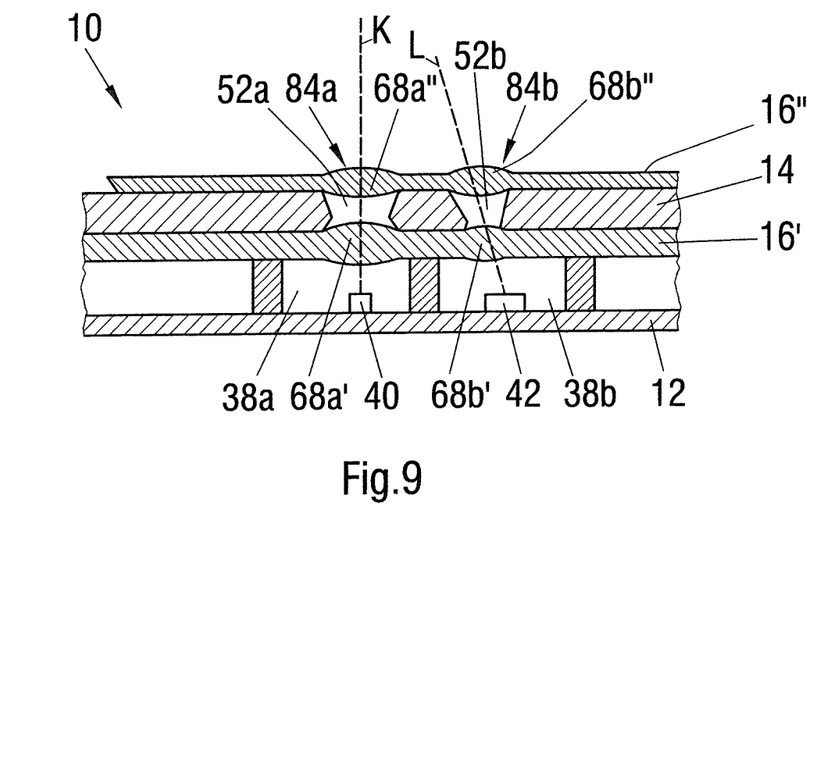
FIG. 9 is a schematic longitudinal sectional view of a further optoelectronic apparatus.

A further possible embodiment is shown in FIG. 9. There, the first optical element comprises a lens element 16' having two lens sections 68'a and 68'b. The second optical element that is arranged thereabove comprises an aperture element 14 that has two aperture sections 52a and 52b formed in a similar manner as in FIGS. 7 and 8. Finally, the third optical element comprises a further lens section 16" having two lens sections 68"a and 68"b that are thinner in comparison with the lens sections 68'a and 68'b. The lens element 16" can be configured as an upper part of a two-part holding device or separately from a single-part holding device (holding device not shown in FIG. 9). If the lens element 16" is formed separately, it can be fastened to the holding device by means of a latching connection and can simultaneously form the upper side of the apparatus 10.

It must still be noted with respect to the explained embodiments that the carrier device 12 can be variably equipped, in particular with different numbers of optoelectronic transmitters 40 and/or optoelectronic receivers 42. A simple adaptation to different applications is possible by the modular construction of the respective optoelectronic apparatus 10, with in particular also a number of aperture sections 52, lens sections 68 or filter sections 94 corresponding to the number of transmitters 40 and receivers 42 being able to be provided by replacing individual components (aperture element 14, 20, filter element 92 or lens element 16).

REFERENCE NUMERAL LIST 10 optoelectronic apparatus
12 carrier device
14 first aperture element
16 lens element
18 lower part
20 upper part or second aperture element
22 bottom section
24 side part
26 catch
28 meshing section
30 receiving space
32 opening
34 latching noses
36 latching catch
38 chamber
40 transmitter
42 receiver
44 ASIC
46 connector
48 projection
50 region
52 aperture section
54 projection
56 region
58 latching tabs
60 coding section
62 first coding element
63 second coding element
64 hollow cylinder
66 ring disk
68 lens section
70 base plate
72 opening
74 latching arm
76 cylinder
78 opening
80 first decoding element
81 second decoding element
83 decoding section
84 optical channel
90 engagement section
92 filter element
94 filter section
K axis
L axis

The invention claimed is:
1. An optoelectronic apparatus comprising:
a carrier device that has at least one optoelectronic transmitter and at least one optoelectronic receiver at an upper side;
at least one first optical element, a second optical element, and a third optical element that are arranged in a layer arrangement above the carrier device, with the second optical element being arranged above the first optical element and the third optical element being arranged above the second optical element, and with each of the first optical element, the second optical element, and the third optical element comprising one of a lens element, an aperture element or a filter element; and a holding device that holds at least the first optical element and the second optical element relative to the carrier device and partly surrounds at least the first optical element and the second optical element, with the holding device forming the third optical element;

wherein the holding device comprises a lower part and an upper part, and wherein at least the carrier device, the first optical element, and the second optical element are captured between the lower part and the upper part of the holding device.

2. The optoelectronic apparatus in accordance with claim 1, wherein one of the first optical element, the second optical element, or the third optical element or a plurality of the first optical element, the second optical element, or the third optical element together form an optical channel for at least one of: the at least one optoelectronic transmitter or the at least one optoelectronic receiver.

3. The optoelectronic apparatus in accordance with claim 1, wherein the respective lens element has at least one of: a lens section for the at least one optoelectronic transmitter or a lens section for the at least one optoelectronic receiver.

4. The optoelectronic apparatus in accordance with claim 1, wherein the respective aperture element one of: defines an angular range of incidence for optical beams that are incident onto the at least one optoelectronic receiver or defines an angular range of emission for optical beams that are emitted by the at least one optoelectronic transmitter.

5. The optoelectronic apparatus in accordance with claim 1, wherein the respective aperture element has at least one of an aperture section for the at least one optoelectronic transmitter or an aperture section for the at least one optoelectronic receiver.

6. The optoelectronic apparatus in accordance with claim 5, wherein at least one of:
the respective aperture section has a cross-section tapering in the direction toward the carrier device, or
the respective aperture section is formed by an at least substantially frustoconical opening.

7. The optoelectronic apparatus in accordance with claim 1, wherein the respective filter element has a planoparallel filter section that has spectral filter properties.

8. The optoelectronic apparatus in accordance with claim 1, wherein the first optical element comprises a first aperture element, the second optical element comprises the lens element, and the third optical element comprises a further aperture element.

9. The optoelectronic apparatus in accordance with claim 1, wherein the first optical element comprises the lens element, the second optical element comprises the aperture element, and the third optical element comprises a further lens element.

10. The optoelectronic apparatus in accordance with claim 1, wherein one of the first optical element, the second optical element, or the third optical element comprises the lens element, another one of the first optical element, the second optical element, or the third optical element comprises the aperture element, and yet another one of the first optical element, the second optical element, or the third optical element comprises the filter element.

11. The optoelectronic apparatus in accordance with claim 1, wherein at least one of the first optical element or the second optical element is captured between the third optical element and the carrier device in a vertical direction.

12. The optoelectronic apparatus in accordance with claim 1, wherein at least one of the first optical element, the second optical element, or the third optical element has at least one receiving recess for receiving another one of the first optical element, the second optical element, or the third optical element.

13. The optoelectronic apparatus in accordance with claim 1, wherein the third optical element comprises the filter element.

14. The optoelectronic apparatus in accordance with claim 13, wherein the second optical element comprises a plurality of lens sections.

15. The optoelectronic apparatus in accordance with claim 1, wherein the lower part and the upper part of the holding device are fastened to one another by means of a latching connection.

16. The optoelectronic apparatus in accordance with claim 1, wherein the third optical element is formed by the upper part of the holding device.

17. The optoelectronic apparatus in accordance with claim 1, wherein the upper part and lower part of the holding device is are formed as one part and have an open upper side, with the third optical element being arranged at the upper side of the holding device.

18. The optoelectronic apparatus in accordance with claim 17, wherein the third optical element is fastened to the holding device by a latching connection.

19. The optoelectronic apparatus in accordance with claim 1, wherein one of the first optical element, the second optical element, or the third optical element has a mechanical coding section that projects out of the holding device and that has at least one coding element for identifying the optoelectronic apparatus.

20. A system comprising:
a plurality of different optoelectronic apparatus comprising:
a carrier device that has at least one optoelectronic transmitter and at least one optoelectronic receiver at an upper side,
at least one first optical element, a second optical element, and a third optical element that are arranged in a layer arrangement above the carrier device, with the second optical element being arranged above the first optical element and the third optical element being arranged above the second optical element, and with each of the at least first optical element, the second optical element, and the third optical element comprising one of a lens element, an aperture element or a filter element, and
a holding device that holds at least the first optical element and the second optical element relative to the carrier device and partly surrounds at least the first optical element and the second optical element, with the holding device forming the third optical element, with each of the first, second and third optical elements positioned above the carrier device, and wherein:
the first optical elements differs in shape from either the second optical element or the third optical element, or
the second optical elements differs in shape from either the first optical element or the third optical element, or
the third optical elements differs in shape from either the second optical element or the first optical element, and the first, second and third optical elements differ from one another with respect to their respective arrangement;

wherein the holding device comprises a lower part and an upper part, and wherein at least the carrier device, the first optical element, and the second optical element are captured between the lower part and the upper part of the holding device.

21. An optoelectronic apparatus, comprising:

a carrier device that has at least one optoelectronic transmitter and at least one optoelectronic receiver at an upper side;

at least one first optical element, a second optical element, and a third optical element that are arranged in a layer arrangement above the carrier device, with the second optical element being arranged above the first optical element and the third optical element being arranged above the second optical element, and with each of the first optical element, the second optical element, and the third optical element comprising a lens element, an aperture element or a filter element; and a holding device that holds at least the first optical element and the second optical element relative to the carrier device and partly surrounds at least the first optical element and the second optical element, wherein the holding device is formed in two parts, and wherein the holding device comprises a lower part and an upper part, wherein the carrier device, the first optical element and the second optical element are captured between the lower part and the upper part of the holding device, wherein the third optical element is formed by the upper part of the holding device, wherein the carrier device, the first optical element and the second optical element are inserted into the lower part, and wherein the upper part closes the lower part and fixes the first optical element and the second optical element to the carrier device.

22. The optoelectronic apparatus of claim 21, wherein the lower part and the upper part of the holding device are fastened to one another by means of a latching connection.

* * * * *